United States Patent
Walsh et al.

[11] Patent Number: 6,143,355
[45] Date of Patent: Nov. 7, 2000

[54] PRINT ALIGNMENT METHOD FOR MULTIPLE PRINT THICK FILM CIRCUITS

[75] Inventors: James Edward Walsh, W. Lafayette; John Karl Isenberg, Rossville; Frans Peter Lautzenhiser, Noblesville, all of Ind.

[73] Assignee: Delphi Technologies, Inc., Troy, Mich.

[21] Appl. No.: 09/251,248

[22] Filed: Feb. 16, 1999

Related U.S. Application Data

[63] Continuation-in-part of application No. 08/946,931, Oct. 8, 1997, abandoned.

[51] Int. Cl.[7] ................................................ B05D 5/12
[52] U.S. Cl. ............................ 427/8; 428/96; 324/525; 324/546; 324/758
[58] Field of Search ............................ 324/525, 546, 324/758, 10; 427/96, 98, 282, 8, 405

[56] References Cited

U.S. PATENT DOCUMENTS

| | | | |
|---|---|---|---|
| 4,617,729 | 10/1986 | Celnik | 29/840 |
| 5,164,747 | 11/1992 | Osada | 346/140 R |
| 5,263,240 | 11/1993 | Nagai et al. | 29/593 |

Primary Examiner—Brian K. Talbot
Attorney, Agent, or Firm—Jimmy L. Funke

[57] ABSTRACT

An improved method of making a multiple print thick film circuit wherein the alignment between successive conductor print steps is both optically inspectable and electrically testable. The first of two or more successive conductor print layers includes a pair of adjacent alignment features with a non-conductive gap therebetween, and the successive conductor print layer includes a pair of identical alignment features which are printed directly on top of the alignment feature pair of the first print layer. When the successive print layer is properly aligned with the first print layer, the non-conductive gap between the alignment features of the first print layer will be preserved, and test probes brought into contact with the features or associated probe pads will reveal a high or open-circuit impedance therebetween. If the successive print layer is mis-aligned relative to the first print layer, one or more of its alignment feature segments or surfaces will bridge the non-conductive gap between the alignment features of the first print layer, and test probes brought into contact with the features or associated probe pads will reveal a low or short-circuit impedance therebetween. Additionally or alternatively, the gap between adjacent alignment features may be optically inspected.

12 Claims, 3 Drawing Sheets

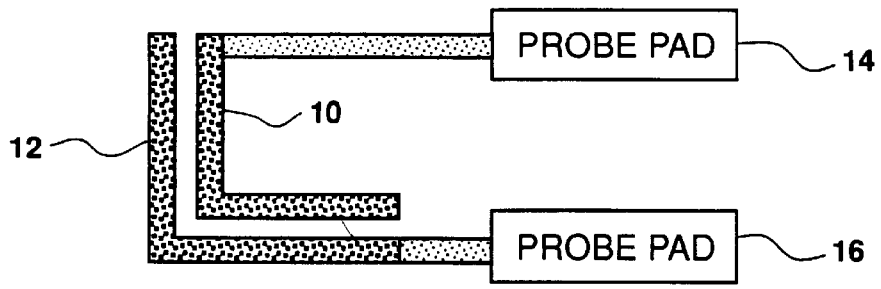
FIG - 1A
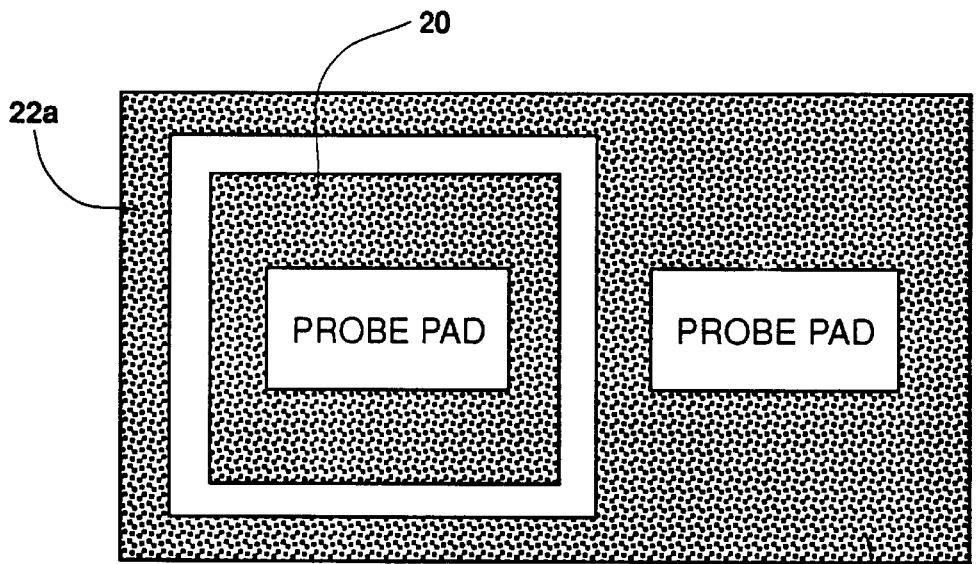
FIG - 1B
FIG - 1C
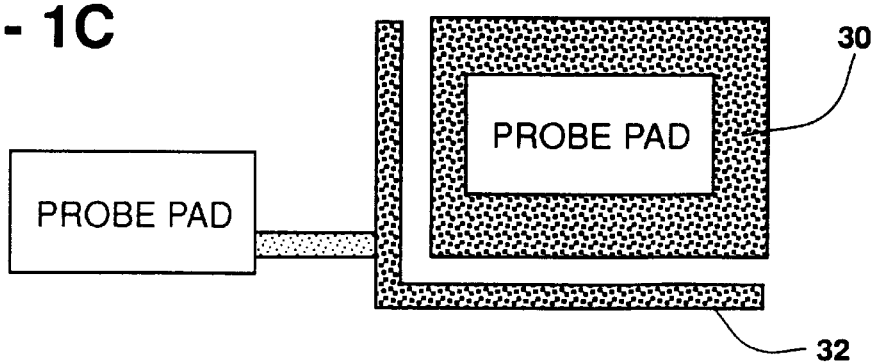

PRINT ALIGNMENT METHOD FOR MULTIPLE PRINT THICK FILM CIRCUITS

RELATED APPLICATIONS

This is a continuation-in-part of U.S. Ser. No. 08/946,931, filed on Oct. 8, 1997, now abandoned.

FIELD OF THE INVENTION

This invention relates to the manufacture and testing of thick film circuits having multiple conductor print steps, and more particularly to a method of making a circuit which includes an optically inspectable and electrically testable print alignment feature.

BACKGROUND OF THE INVENTION

In the manufacture of thick film circuits, a conductive ink composition is wiped across a print screen by a squeegee to form a conductor pattern on substrate underlying the print screen. Normally, a layer of dielectric is interposed between successive conductor print layers, but it has been proposed to use multiple successive conductor printing steps with no intervening dielectric. In certain cases, multiple printing is used to produce fine pitch features; in other cases, it is used to over-print as a means of improving reliability or producing extra thick or multiple composition conductor systems.

In the manufacture of single print thick film circuits, it is customary to print an alignment or registration feature in the margin of the substrate that can be optically inspected to measure the alignment of the print relative to the substrate or a previous print. Such optical alignment testing is time-consuming and is generally performed off-line on a random basis to detect gross alignment errors. Moreover, such optical alignment testing is fairly limited, as it cannot be used to detect other printing flaws such as excessive line spread, and localized print distortion due to stretching of the print screen, for example. These flaws are particularly significant in multiple print circuits because misalignment, localized print distortion and excessive line spread may result in inadvertent shorting between conductors, especially in fine pitch circuits.

SUMMARY OF THE INVENTION

The present invention is directed to an improved method of making a multiple print thick film circuit wherein the alignment between successive conductor print layers is both optically inspectable and electrically testable. The first of two or more successive conductor print layers includes a pair of adjacent alignment features with a non-conductive gap separating such features, and the successive conductor print layer includes an identical pair of adjacent alignment features which are printed in registry with—that is, directly atop—the pair of adjacent alignment features of the first print layer. There is a non-conductive gap between each pair of adjacent alignment features, so that with proper alignment between the first and successive print layers, the non-conductive gap between the alignment features of the first print layer remains intact. In such case, test probes brought into contact with the features or associated probe pads of either print layer will reveal a high or open-circuit impedance therebetween. However, if the successive print layer is mis-aligned relative to the first print layer, one or more of the alignment features of the successive print layer will bridge the gap between the alignment features of the first print layer. In such case, test probes brought into contact with the adjacent alignment features or associated probe pads of either print layer will reveal a low or short-circuit impedance therebetween. If desired, the degree of mis-alignment may be optically determined with conventional vision equipment. In general, optical inspection may be performed shortly after printing, whereas electrical inspection may be performed after firing.

In a preferred embodiment, each alignment feature is in the shape of an upper case L or a box, defined by at least two contiguous mutually perpendicular conductor segments or surfaces. Additionally, the spacing between adjacent alignment features is preferably less than the smallest conductor spacing on the circuit. Because the gap between adjacent alignment features is smaller than the circuit spacing, the test equipment can detect alignment errors large enough to short-circuit the adjacent alignment features, but not so large as to cause shorting in the actual circuit.

A particularly advantageous aspect of this invention is that alignment features may be formed at multiple locations throughout the substrate. This provides more comprehensive alignment information in substantially the same amount of time, and can be used to detect localized distortion due to stretching of the print screen, for example. This information can be used to signal the operator to replace the worn screen. Moreover, if only a portion of the circuit features are mis-aligned due to such stretching, the testing will indicate which circuits are mis-aligned and which circuits are properly aligned. In addition, adjacent alignment features may span a pair of adjacent circuits to minimize the circuit board area used for the alignment features, and to increase layout flexibility.

BRIEF DESCRIPTION OF THE DRAWINGS

FIG. 1A depicts a pair of L-shaped alignment features; FIG. 1B depicts a box-shaped inner alignment feature with an encircling outer alignment feature; and FIG. 1C depicts box-shaped alignment feature with an L-shaped alignment feature.

DETAILED DESCRIPTION OF THE DRAWINGS

Figure 2:
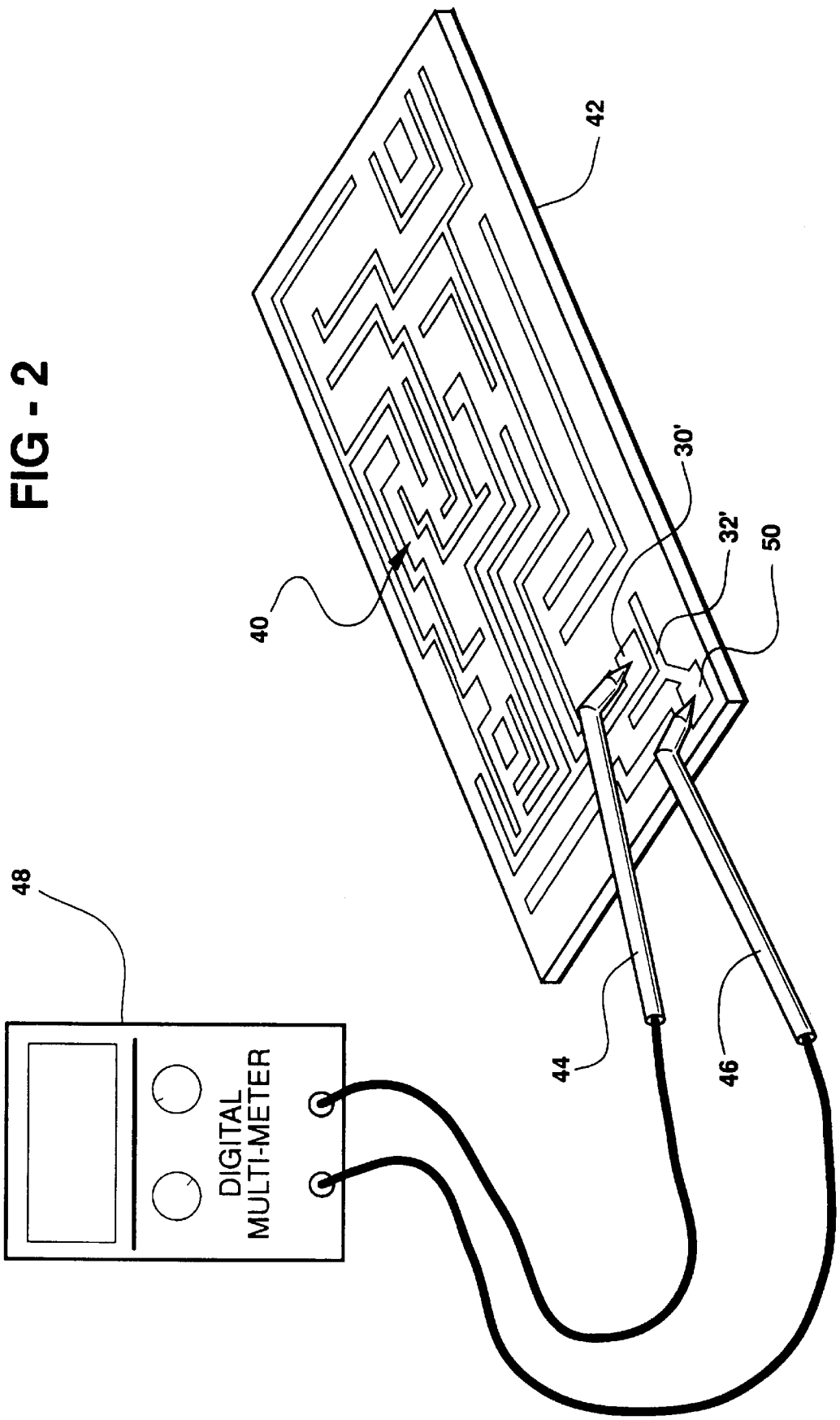
FIG. 2 is an illustration of a circuit according to this invention under test.

FIGS. 1–4 depict the optically inspectable and electrically testable alignment features according to this invention. In each depicted embodiment, a first pair of alignment features is printed as part of a first conductor print layer, and a second pair of identical alignment features is printed directly atop the first pair as part of a successive conductor print layer, with no intervening dielectric. It will therefore be understood in respect to any of the FIGS. 1–4, that to the extent the top print layer overlaps a previous print layer, only the top print layer can be seen. FIGS. 1A–1C are only intended to illustrate various alternative alignment feature shapes, and the depicted features (10,12; 20,22; 30,32) may be thought of as being part of the first print layer or a successive print layer, since the features of the successive print layer are identical to, and are printed directly on top of, the features of the first print layer, as described above.

The alignment features depicted in FIGS. 1A–1C may be generally described as comprising first and second contiguous mutually perpendicular conductor segments or surfaces. In certain embodiments, at least one of the alignment features is in the shape of an upper case L. In other embodiments, at least one of the alignment features is in the shape of a square or rectangular box. In each case, the spacing between adjacent alignment features is preferably smaller than the spacing between adjacent conductors in the body of the circuit. In this way, a small degree of misalignment that does not cause shorting between adjacent conductors in the body of the circuit will be detected by shorting between the more closely spaced alignment features. Likewise, excessive conductor spread due to ink composition anomalies will be detected by shorting of the adjacent alignment features before the actual circuit features are adversely affected.

In the embodiment of FIG. 1A, each of the adjacent alignment features 10,12 is L-shaped. The feature 10 is connected to probe pad 14 and the feature 12 is connected to probe pad 16. The probe pads may be printed as part of the same conductor print layer, or may be pre-existing from an earlier print layer. In the embodiment of FIG. 1B, one alignment feature 20 is in the shape of a box, while the other alignment feature 22 is in the shape of an adjacent box with a contiguous loop portion 22a that encircles the feature 20; in this case, probe pads are provided in the center areas of each feature. In the embodiment of FIG. 1C, one alignment feature 30 is in the form of a box, and the other feature 32 is L-shaped with its conductor segments in close proximity to two contiguous edges of the feature 30; this configuration is also shown in the testing illustration of FIG. 2 and the multiple circuit illustration of FIG. 3.

FIG. 2 illustrates off-line electrical testing of alignment using the general alignment feature topology of FIG. 1C. Thus, various conductor patterns generally designated by the reference numeral 40 are printed on the substrate 42, and the probes 44, 46 of an electrical impedance tester 48 are placed in contact with the probe pads of the adjacent alignment features. In the illustration, the box-shaped alignment feature 30' also serves as a bond pad for the circuit, and the L-shaped alignment feature 32' is coupled to the probe pad 50. The tester 48 may be a digital multi-meter, or a more sophisticated piece of in-line equipment such as an automated laser trimmer/tester having probes that are automatically brought into contact with various probe and bond pads for functional testing and laser trimming. If the top conductor print layer is proper aligned with the first or previous conductor print layer, the non-conductive gap between the alignment features 30', 32' of the previous print layer remains intact, and the tester 48 will indicate a high or open-circuit impedance between the feature 30' and the probe pad 50. However, if the top print layer is mis-aligned relative to the first or previous print layer, one or more of the alignment features of the top print layer will bridge the gap between the alignment features of the first print layer, and the tester 48 will indicate a low or short-circuit impedance between the feature 30' and the probe pad 50. Alternatively, the degree of mis-alignment may be optically determined with conventional vision equipment. In general, optical inspection may be performed shortly after printing, whereas electrical inspection may be performed after firing.

A particularly advantageous application of this invention may be realized with substrates that contain several independent circuits which are later separated in a singulation step. In this case, the above described alignment features may be printed at each circuit location on the substrate to provide an optically inspectable and electrically testable alignment check for each circuit. This can be easily achieved because the alignment features can be very small. In this way, the test equipment can be used to identify and discard circuits having improper print alignment due to localized stretching of the print screen, or localized conductor spreading, for example.

Figure 3:
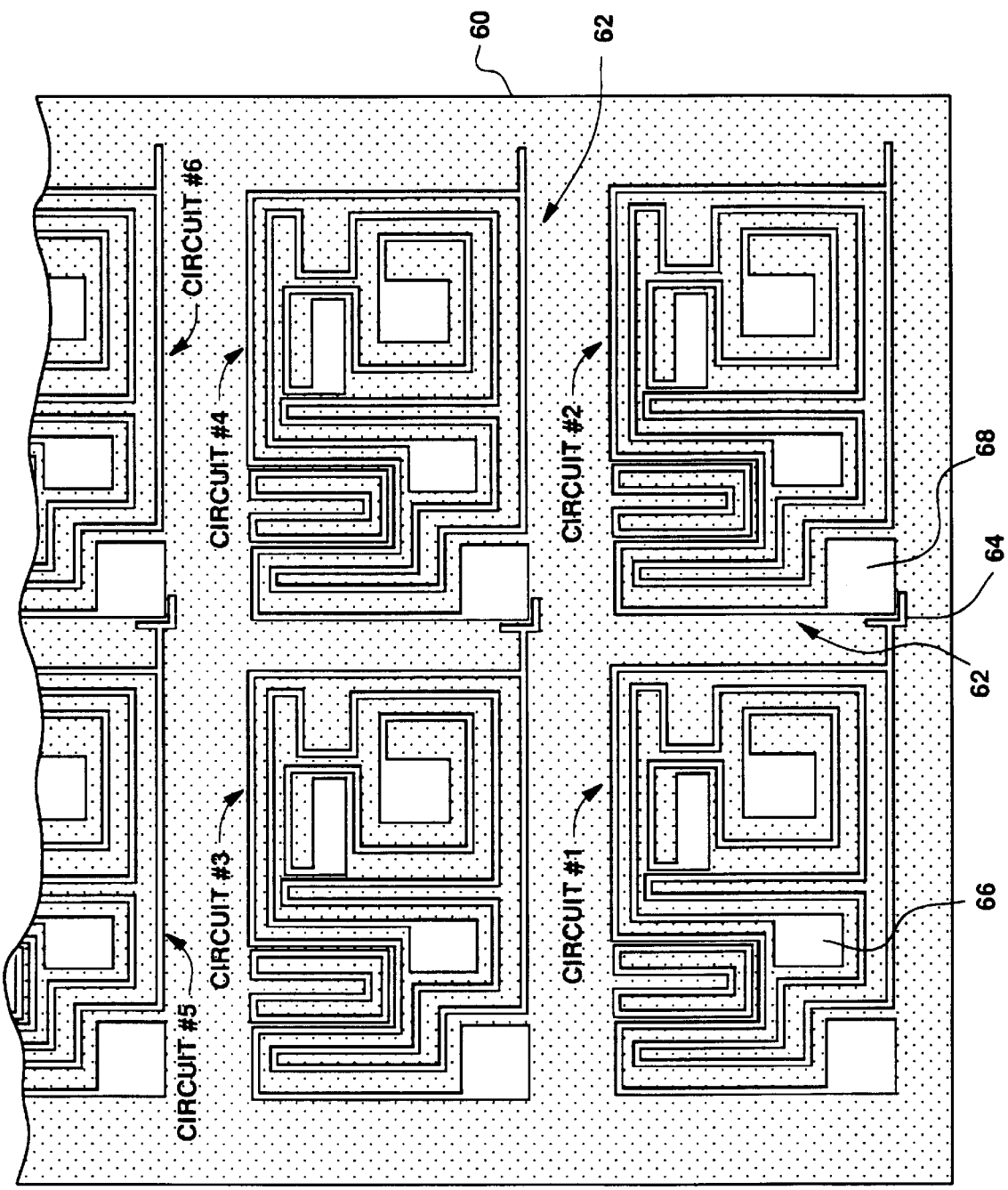
FIG. 3 depicts a substrate having multiple circuits, where the alignment features of this invention span adjacent circuits.

FIG. 3 illustrates a portion of a multiple circuit substrate having multiple alignment features, and a particularly advantageous embodiment in which adjacent alignment feature elements span from one circuit to another. Referring to FIG. 3, the reference numeral 60 generally designates a substrate having formed thereon several identical individual circuits, identified as Circuit #1, Circuit #2, and so on. Inter-circuit or marginal regions 62 of the substrate 60 between the various circuits are reserved to accommodate the singulation step referred to above. In the illustrated embodiment, an alignment feature comprising a pair of adjacent alignment elements substantially as shown in FIG. 1C is provided for each pair of adjacent circuits, although other alignment feature patterns could be used as well. For example, an L-shaped alignment feature 64 electrically coupled to a bond or probe pad 66 of Circuit #1 is positioned in proximity to an existing bond or probe pad 68 at the periphery of Circuit #2. In the illustration, a similar arrangement is utilized between Circuit #'s 3 and 4, and Circuit #'s 5 and 6. This arrangement has two important advantages. First, it utilizes some of the inter-circuit region 62 between adjacent circuits, instead of taking up space that would normally be used for circuit traces or elements. And second, it minimizes the impact of alignment feature shorting on any given circuit, since alignment feature shorting (due to misalignment) results only in circuit-to-circuit shorting, which will be eliminated in the singulation process anyway—as a consequence, any existing bond or probe pad may be used as an alignment feature without having to design the circuits to tolerate inter-circuit shorting due to minor mis-alignment that causes alignment feature shorting.

In summary, the method of this invention significantly improves the alignment testability of thick film circuits having multiple conductor print steps. The alignment features occupy minimal space on the circuit board, and provide both optical inspectability and electrical testability. Optical inspection can be carried out shortly after printing, and can be used to detect misalignment relatively early in the manufacturing process. Electrical testing can be carried out after firing, and is used to accurately detect misalignment sufficient to short circuit adjacent alignment features. The provision of multiple pairs of alignment features yields further information with no increase in test time since automated test equipment can test for impedance at multiple locations in parallel. While described in reference to the illustrated embodiments, it is expected that various modifications will occur to those skilled in the art. In this regard, it will be understood that the scope of this invention is not limited to the illustrated embodiments and that methods incorporating such modifications may fall within the scope of this invention, which is defined by the appended claims.

The embodiments of the invention in which an exclusive property or privilege is claimed are defined as follows:

1. A method of making a thick film circuit having first and second print layers of conductive material with no dielectric layer between the first and second print layers, comprising the steps of:

printing, as part of said first print layer, a first pair of adjacent alignment features with a non-conductive gap separating the alignment features of such first pair;

printing, as part of said second print layer, a second pair of alignment features substantially identical to said first pair, said second pair of alignment features being printed directly on top of said first pair of alignment features when said second print layer is properly aligned with respect to said first print layer;

measuring an open-circuit impedance between said first or second pairs of alignment features when said second print layer is properly aligned with respect to said first print layer; and measuring a short-circuit impedance between said first or second pairs of alignment features when said second print layer is sufficiently mis-aligned with respect to said first print layer that at least a portion of said second pair of alignment features bridges said non-conductive gap separating the alignment features of said first pair.

2. The method of claim 1, wherein the first and second print layers include circuit traces in addition to said alignment features, and said non-conductive gap is less than a minimum distance between adjacent circuit traces when said second print layer is properly aligned with respect to said first print layer.

3. The method of claim 1, wherein:

said first print layer includes a first plurality of pairs of adjacent alignment features, with non-conductive gaps separating the alignment features of each of such pairs;

said second print layer includes a second plurality of pairs of alignment features substantially identical to said first plurality of pairs, and printed directly on top of said first plurality of pairs when said second print layer is properly aligned with respect to said first print layer;

wherein measured impedances between the first or second plurality of pairs of adjacent alignment features provides an indication of localized mis-alignment of said second print layer with respect to said first print layer.

4. The method of claim 1, wherein said first and second print layers include probe pads electrically coupled to individual alignment features for measuring said impedance.

5. The method of claim 1, wherein each of said alignment features is defined by contiguous mutually perpendicular conductor segments or surfaces.

6. The method of claim 5, wherein at least one of said alignment features is L-shaped.

7. The method of claim 5, wherein at least one of said alignment features is box-shaped.

8. The method of claim 5, wherein one of said first pair of alignment features is L-shaped, and the other of said first pair of alignment features is box-shaped.

9. The method of claim 5, wherein one of said first pair of alignment features is box-shaped, and the other of said first pair of alignment features is box-shaped with contiguous conductor segments that are parallel to but displaced from two or more sides of said one alignment feature.

10. The method of claim 9, wherein said contiguous conductor segments of said other alignment feature encircle said one alignment feature.

11. The method of claim 1, wherein said first and second print layers define at least first and second individual circuits, and said first pair of adjacent alignment features includes one alignment feature electrically coupled to said first circuit and another alignment feature electrically coupled to said second circuit.

12. The method of claim 11, wherein said first and second circuits are separated by inter-circuit regions to accommodate singulation of said circuits, said one alignment feature is a conductor segment or surface disposed at a peripheral region of said first circuit, and said other alignment feature is a conductor segment or surface electrically coupled to said second circuit by a conductor trace disposed in said inter-circuit region.

* * * * *